(12) United States Patent
Weller et al.

(10) Patent No.: US 10,966,312 B1
(45) Date of Patent: Mar. 30, 2021

(54) PRINTED LITZ LINE

(71) Applicants: Sciperio, Inc, Orlando, FL (US); University of South Florida, Tampa, FL (US)

(72) Inventors: Thomas Weller, Lutz, FL (US); Kenneth H. Church, Orlando, FL (US); Ramiro A Ramirez, Tampa, FL (US); Paul I. Deffenbaugh, Orlando, FL (US); Casey W. Perkowski, Winter Park, FL (US)

(73) Assignees: Sciperio, Inc, Orlando, FL (US); University of South Florida, Tampa, FL (US)

( * ) Notice: Subject to any disclaimer, the term of this patent is extended or adjusted under 35 U.S.C. 154(b) by 0 days.

(21) Appl. No.: 16/374,416

(22) Filed: Apr. 3, 2019

Related U.S. Application Data

(60) Provisional application No. 62/652,794, filed on Apr. 4, 2018.

(51) Int. Cl.
| | | |
|---|---|---|
| *H05K 1/02* | (2006.01) | |
| *H05K 3/02* | (2006.01) | |
| *H05K 1/11* | (2006.01) | |
| *H05K 3/12* | (2006.01) | |
| *H05K 3/40* | (2006.01) | |
| *H05K 1/09* | (2006.01) | |

(52) U.S. Cl.
CPC ......... *H05K 1/0242* (2013.01); *H05K 1/0245* (2013.01); *H05K 1/115* (2013.01); *H05K 3/027* (2013.01); *H05K 3/12* (2013.01); *H05K 3/4053* (2013.01); *H05K 1/09* (2013.01); *H05K 2201/09236* (2013.01); *H05K 2203/107* (2013.01)

(58) Field of Classification Search
CPC .......... H01F 27/24; H01F 27/28; H01F 27/30; H05K 1/16; H05K 3/12; H05K 3/143; H05K 3/146; H05K 1/0242; H05K 1/0245; H05K 1/09; H05K 1/115; H05K 3/027; H05K 3/4053; H05K 2201/09236; H05K 2203/107; H01P 3/08
See application file for complete search history.

(56) References Cited

U.S. PATENT DOCUMENTS

| | | | | |
|---|---|---|---|---|
| 3,274,328 A * | 9/1966 | Davis | ................... | H05K 1/0353 174/258 |
| 3,808,049 A * | 4/1974 | Caley | ................... | H01L 27/016 427/97.4 |
| 4,152,679 A * | 5/1979 | Chen | ................... | H01F 17/0006 333/150 |
| 4,703,392 A * | 10/1987 | Robertson | ............... | H01P 3/081 174/257 |
| 8,198,962 B2 * | 6/2012 | Yang | ....................... | H01P 3/003 333/238 |
| 9,504,165 B2 * | 11/2016 | Wang | ..................... | H05K 3/146 |

OTHER PUBLICATIONS

Design and Implementation of PCB Inductors With Litz-Wire Structure for Conventional-Size Large-Signal Domestic Induction Heating Application by Ignacio Lope et al. IEEE Transactions On Industry Applications, vol. 51, No. 3, May/Jun. 2015.*

* cited by examiner

*Primary Examiner* — Carl J Arbes
(74) *Attorney, Agent, or Firm* — Goodhue, Coleman & Owens, P.C.

(57) ABSTRACT

An apparatus includes a substrate and an electronic circuit comprising a plurality of conductive tracts forming a printed litz line on the substrate for distributing a signal therebetween in order to increase effective conductance relative to a single conductive line not divided into tracts. The plurality of conductive tracts may be formed by printing a pattern on the substrate and removing portions of the pattern to leave the plurality of conductive tracts. The removing portions of the pattern may be performed by a removal process such as laser cutting, milling, etching, or masking. For example, the removal may be performed by applying ultrashort laser pulses. The printing may be performed by a jetting process, a spray process, an extrusion process, a dispensing process, and/or other types of processes for applying materials.

14 Claims, 10 Drawing Sheets

PRINTED LITZ LINE

PRIORITY STATEMENT

This application claims priority to U.S. Provisional Patent Application No. 62/652,794 filed Apr. 4, 2018, hereby incorporated by reference in its entirety.

GRANT REFERENCE

This invention was made with government support 1509762 awarded by the National Science Foundation. The Government has certain rights in the invention.

FIELD OF THE INVENTION

The present invention relates to radio-frequency (RF) electronics. More particularly, but not exclusively, the present invention relates to a printed equivalent of an RF litz wire or litz line.

BACKGROUND

A litz line or litz wire generally consists of a plurality of strands of wired which are electrically insulated from one another with the strands generally being twisted or woven. Litz line is used to conduct radio-frequency (RF) signals. The benefit of the structure of a litz line is to reduce skin effect and proximity losses. Thus, benefits are obtained from using the litz line which are useful in a variety of RF applications.

However, there are several limitations on the use of the litz line. First, given the physical structure of the litz line, there are limitations in the frequencies of RF signals for which transmission benefits may be achieved. A further limitation is that litz lines do not lend themselves well to modern circuit manufacturing processes including increasing miniaturization of electronic devices, especially as needed in various RF applications.

Therefore, what is needed is a printed litz line that provides the advantages of a traditional litz line but may be created through printed circuit board (PCB) manufacturing processes or 3D printing techniques and allows for use at higher frequencies than commonly used for conventional litz lines.

SUMMARY

Therefore, it is a primary object, feature, or advantage of the present invention to improve over the state of the art.

It is a further object, feature, or advantage of the present invention to print an equivalent to a litz line ("printed litz line") using PCB manufacturing processes, 3D printing, or other manufacturing techniques.

It is a still further object, feature, or advantage of the present invention to provide for a printed litz line which may be printed on a conformal surface.

Another object, feature, or advantage is to provide a printed litz line with vias.

Yet another object, feature, or advantage is to provide a printed litz line with trimmed edges which may increase conductivity on low temperature surfaces where high temperature processing is not possible.

A further object, feature, or advantage is to use ultra short pulses to reduce/eliminate damage and to print the litz lines to bare die and edge/treat the printed line.

A still further object, feature, or advantage is to provide a litz line which results in a composite effect of an average increase in conductivity.

A further object, feature, or advantage is to provide a litz line which overcomes limitations in the frequencies of RF signals with which it is used.

One or more of these and/or other objects, features, or advantages of the present invention will become apparent from the specification and claims that follow. No single embodiment need provide each and every object, feature, or advantage. Different embodiments may have different objects, features, or advantages. Therefore, the present invention is not to be limited to or by any objects, features, or advantages stated herein.

According to one aspect, an apparatus includes a substrate and an electronic circuit comprising a plurality of conductive tracts forming a printed litz line on the substrate for distributing a signal therebetween in order to increase effective conductance relative to a single conductive line. The plurality of conductive tracts may be formed by printing a pattern on the substrate and removing portions of the pattern to leave the plurality of conductive tracts. The removing portions of the pattern may be performed by a removal process such as laser cutting, milling, etching, or masking. For example, the removal may performed by applying ultrashort laser pulses. The printing may be performed by a jetting process, a spray process, an extrusion process, a dispensing process, and/or other types of processes for applying materials. The edges of the pattern may be trimmed. The pattern may be a line and the line may be edged. The substrate may be a planar surface, a conformal surface, may be the surface of a bare die, a surface with a ramp transition, a surface associated with a via, or other type of surface.

According to another aspect, a method of manufacturing an electronic circuit may include forming a printed litz line comprising a plurality of conductive tracts for distributing a signal in order to increase effective conductance relative to a single conductive line. The forming the printed litz line may include printing a pattern comprising a conductive material on a substrate and removing a portion of the pattern to leave the plurality of conductive tracts. The removal may be performed by laser cutting, milling, etching, and/or masking. Where laser cutting is used it may involve ultrashort laser pulses. The method may further include trimming edges of the pattern. The pattern may include a line having a thickness of less than 100 μm. The substrate may be planar, non-planar, conformal, or non-conformal with a plurality of bends, have a ramp transition, be associated with a via, be associated with a bare die, or otherwise. The printing may be performed by a jetting process, a spray process, an extrusion process, a dispensing process, and/or other types of processes for applying materials.

According to another aspect, a method for using an electronic circuit includes conveying a signal distributed amongst a plurality of tracts of a printed litz line to increase effective conductance relative to a single line not divided into tracts.

BRIEF DESCRIPTION OF THE DRAWINGS

Illustrated embodiments of the disclosure are described in detail below with reference to the attached drawing figures, which are incorporated by reference herein.

DETAILED DESCRIPTION

The present invention provides for multiple lines that run parallel with one another with gaps therebetween. This structure may be used to carry an RF signal in a manner which is an improvement over other existing transmission lines. The composite effect of the multiple lines in parallel result in an average increase in conductivity.

More particularly, the present invention provides an equivalent of an RF Litz line. It includes a plurality of conductive traces or tracts with slots which may used for transmitting an RF signal. This design assists with distributing current as well as increasing performance. This is advantageous over existing transmission lines such as microstrips and co-planar waveguides. This results in improved transmission of RF signals and may be used in a number of different applications. There are numerous applications including use in RF circuits and devices such as antennas. This may be produced using existing processes such as traditional PCB manufacturing processes as well as processes such as those used for 3D printed electronics. Thus, the benefits of litz lines may be extended up to higher frequencies.

Figure 1:
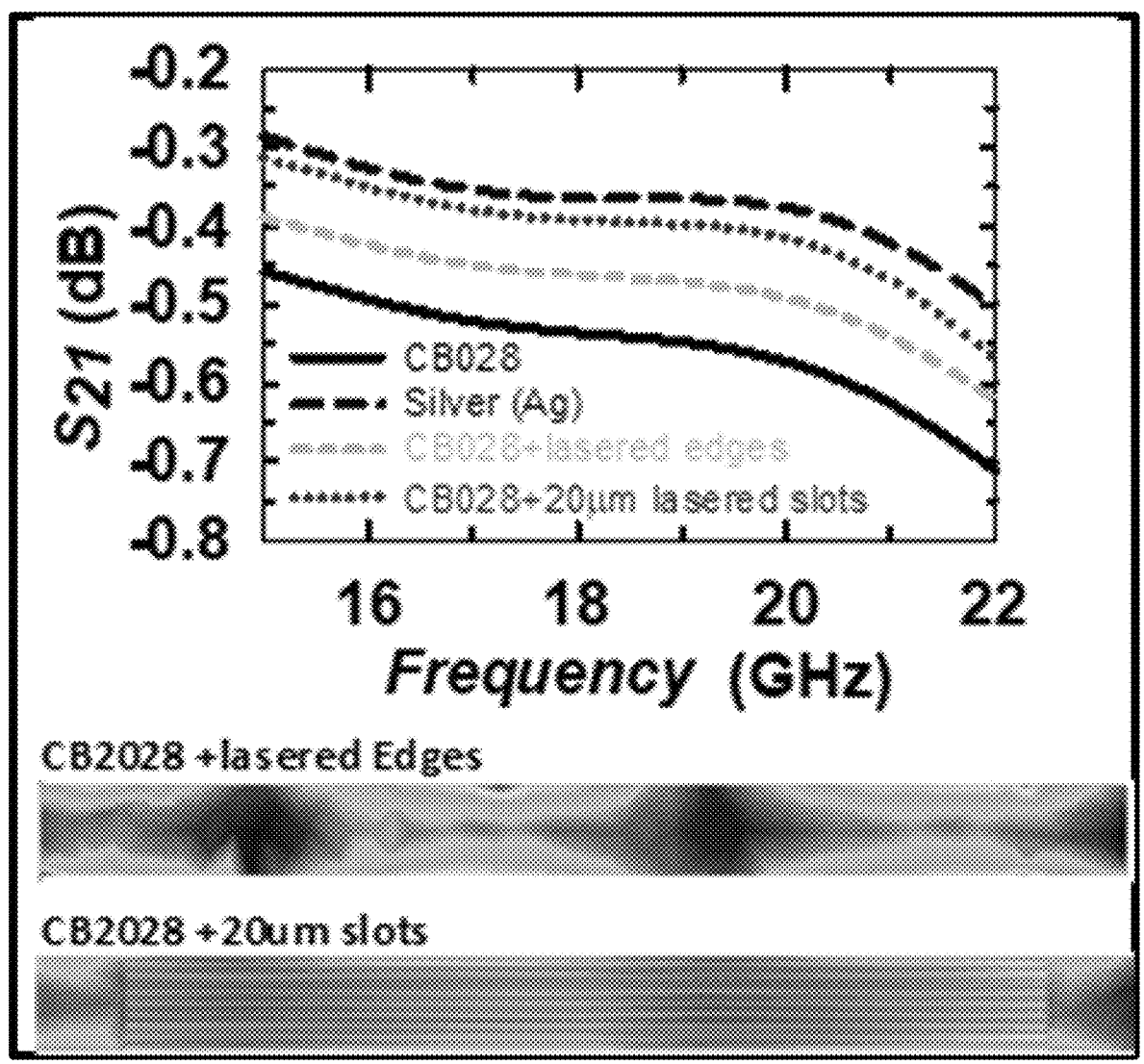
FIG. 1 illustrates the S-parameter as a function of frequency for different materials including a hypothetical solid silver, solid CB028, CB028 with laser trimmed edges, and CB028 with 20 micron spaced laser cut slots. For purposes here, for the conductivity it is assumed $\sigma_{CB028}$=8e5 S/m and $\sigma_{silver}$=6.1e7 S/m.

FIG. 1 illustrates the S-parameter as a function of frequency for different materials including a hypothetical solid silver, solid CB028, CB028 with laser trimmed edges, and CB028 with 20 micron spaced laser cut slots. DuPont CB028 is a silver conductor used in fabricating low-voltage circuitry. It is used for its high conductivity and fine line printing capability. For purposes here, the conductivities (S/m) are assumed, $\sigma_{CB028}$=8e5 S/m and $\sigma_{silver}$=6.1e7 S/m. It is desirable to have the least amount of loss as possible at high frequencies of interest. Here, the CB028 with lasered edges improves over CB028. The CB028 with 20 μm lasered edges offers a further improvement very close to results expected with hypothetical solid silver. Below the graph, the CB028 with lasered edges and CB028 with 20 μm slots are mapped.

Figure 2:
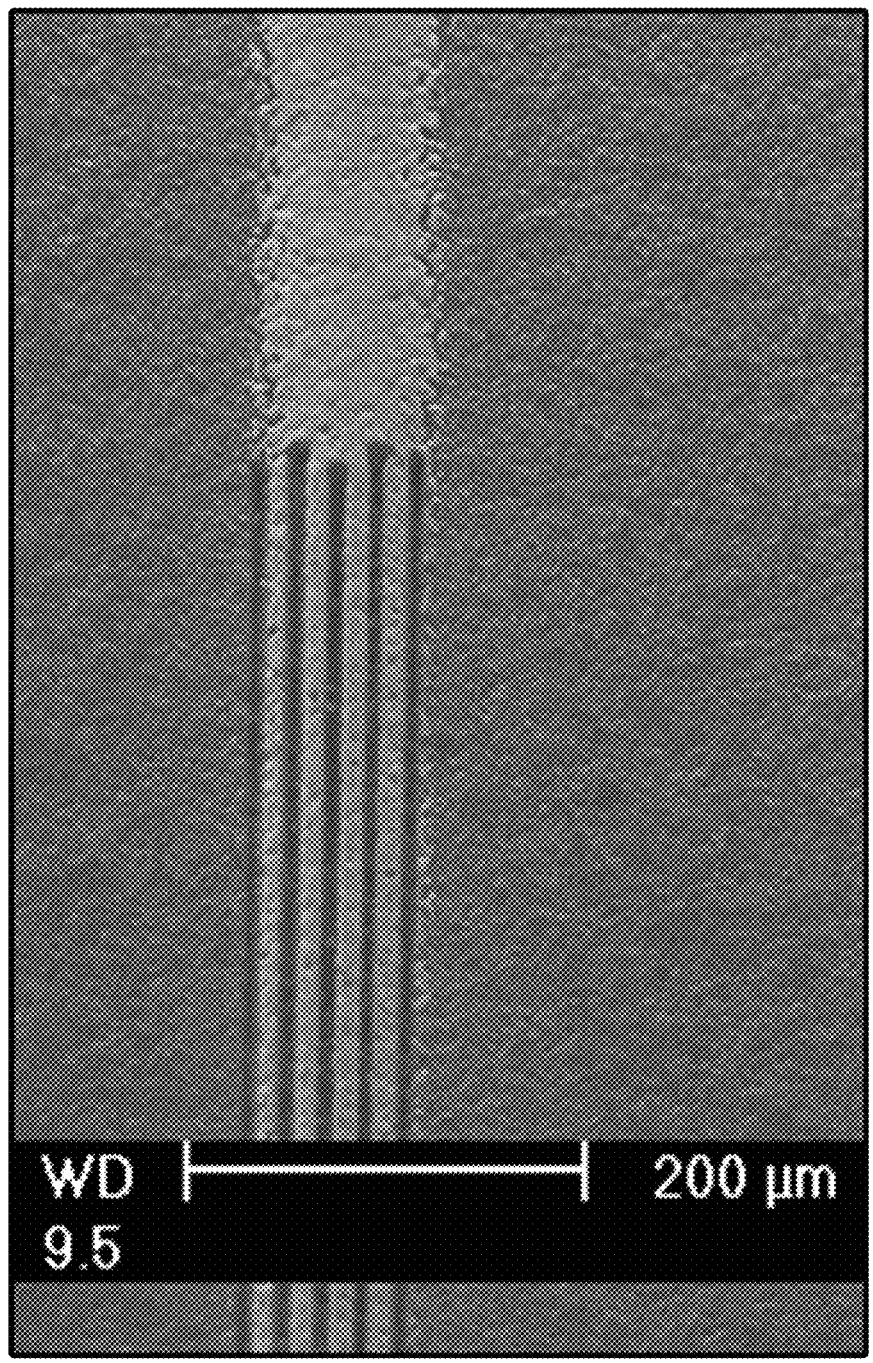
FIG. 2 illustrates ultra short pulsed cuts into a printed silver conductor.

FIG. 2 illustrates ultra short pulsed cuts into a printed silver conductor to form the RF litz wire. Here, the ultra short pulsed cuts in the conductor creates a plurality of conductive tracts with slots. The scale at the bottom makes clear that the litz line may be of nanoscale, for example, less than about 100 nanometers for the RF litz wire. An ultra short pulse is generally between about $10^{-12}$ and $10^{-15}$ seconds in duration. A short pulse may generally be about $10^{-9}$ seconds. It should be understood that although ultra short pulses may be used, short pulses, or other pulses may be used. It is to be further understood that instead of using a laser, other types of energy sources may be used.

Figure 3:
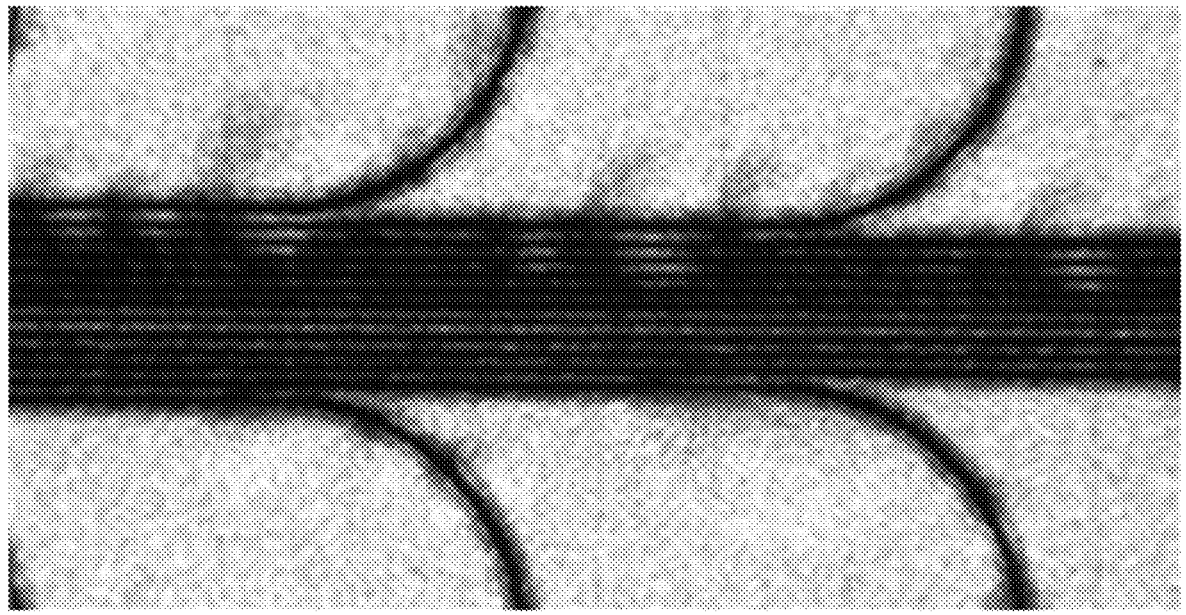
FIG. 3 further illustrates ultra short pulsed cuts into a printed silver conductor.

FIG. 3 further illustrates ultra short pulsed cuts into a printed silver conductor.

Figure 4:
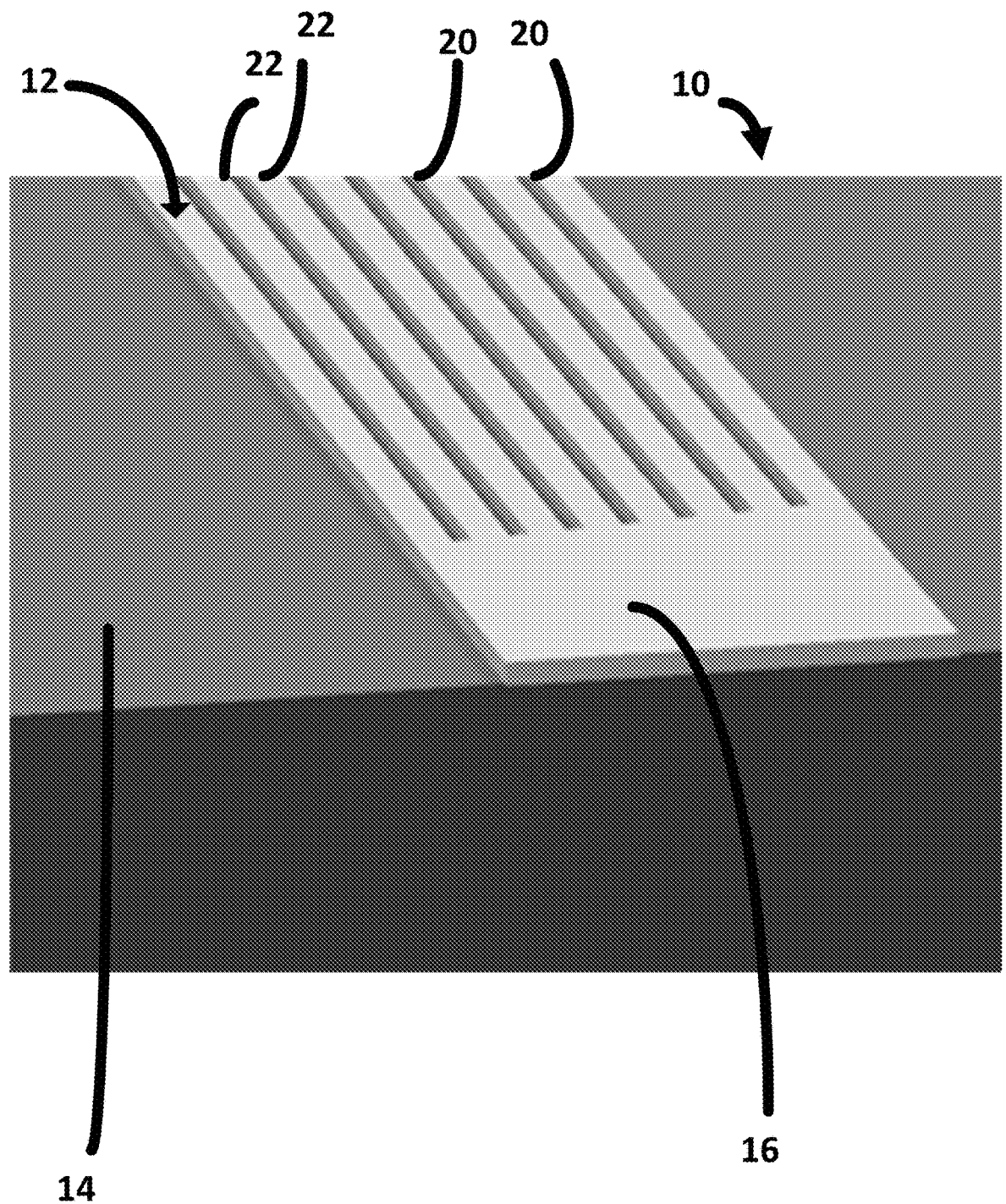
FIG. 4 illustrates a rendering of the beginning/end of a printed litz line.
Figure 5:
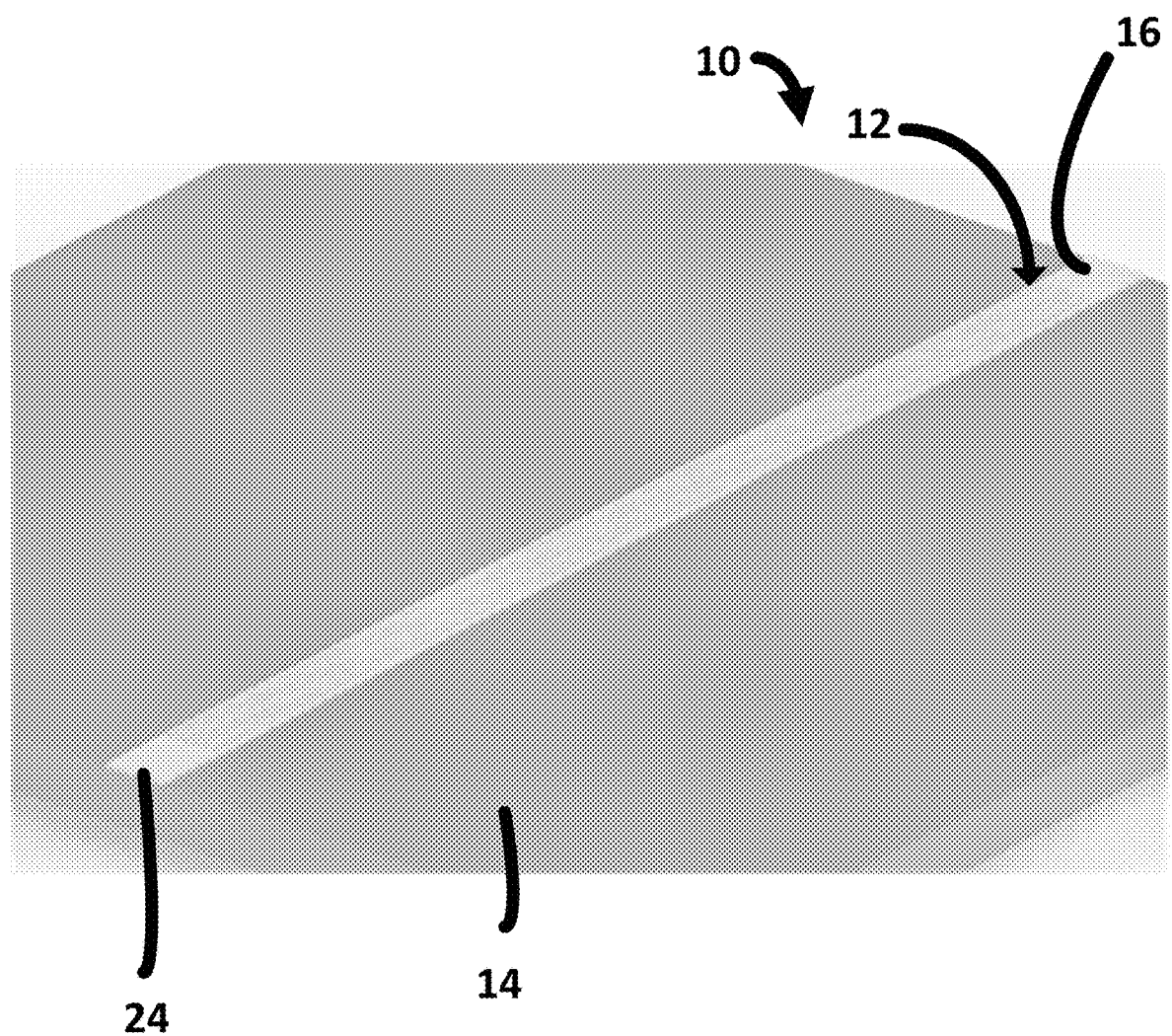
FIG. 5 further illustrates a rendering of a printed litz line.

FIG. 4 illustrates a rendering of the beginning/end of a printed litz line 12 on a substrate 14 which may form a part of an electronic circuit 10. At the end of the printed line 12 there is a terminal area 16. The slots or cuts 20 in the printed line 12 may be made from one terminal area 16 to an opposite terminal area. The printed litz line 12 has a plurality of conductive tracts 22 between the slots 20. FIG. 5 further illustrates a rendering of a printed litz line with opposite terminal areas 16, 24. Although terminal areas are shown, it is to be understood that any number of different configurations may be used as may be appropriate for a particular use. For example, conductive traces need not all begin and end in the same terminal area. The substrate 14 may be of any number of different types. The substrate 14 may, for example, be a surface of a bare die.

The initial printed line or pattern may be formed according to any number of different manufacturing processes which are capable of making a printed line. Examples of such processes may include, without limitation, jetting processes, spray processes, extrusion processes, dispensing processes, and other types of processes. The initial line may have a line thickness of less than 100 um, less than 75 μm, or smaller.

Cuts in the printed lines may be made within the initial line using any number of different manufacturing methods. Examples of such methods may include, without limitation, laser cutting, milling, etching, masking, and other types of methods. As shown best in FIG. 2, the resulting tracts will have a line thickness smaller than the initial printed line or pattern. For example, as shown in FIG. 2, the resulting tracts may be less than about 10 μm or smaller.

The printed lines may be formed on a planar surface or a conformal surface having one or more bends such as a curved surface. The edges of the lines may be trimmed. Trimming the edges of the lines assists with increasing conductivity on low temperature surface and where high temperature processing is not possible. After depositing, the printed lines may be cut while on the conformal surface. As previously explained, the printed lines may be cut in various ways. For example, ultrashort laser pulses may be used to reduce or eliminate damage. The lines may be printed to a bare die and then one may edge or treat the printed line (including on the bare die) without damage to the bare die.

Figure 6:
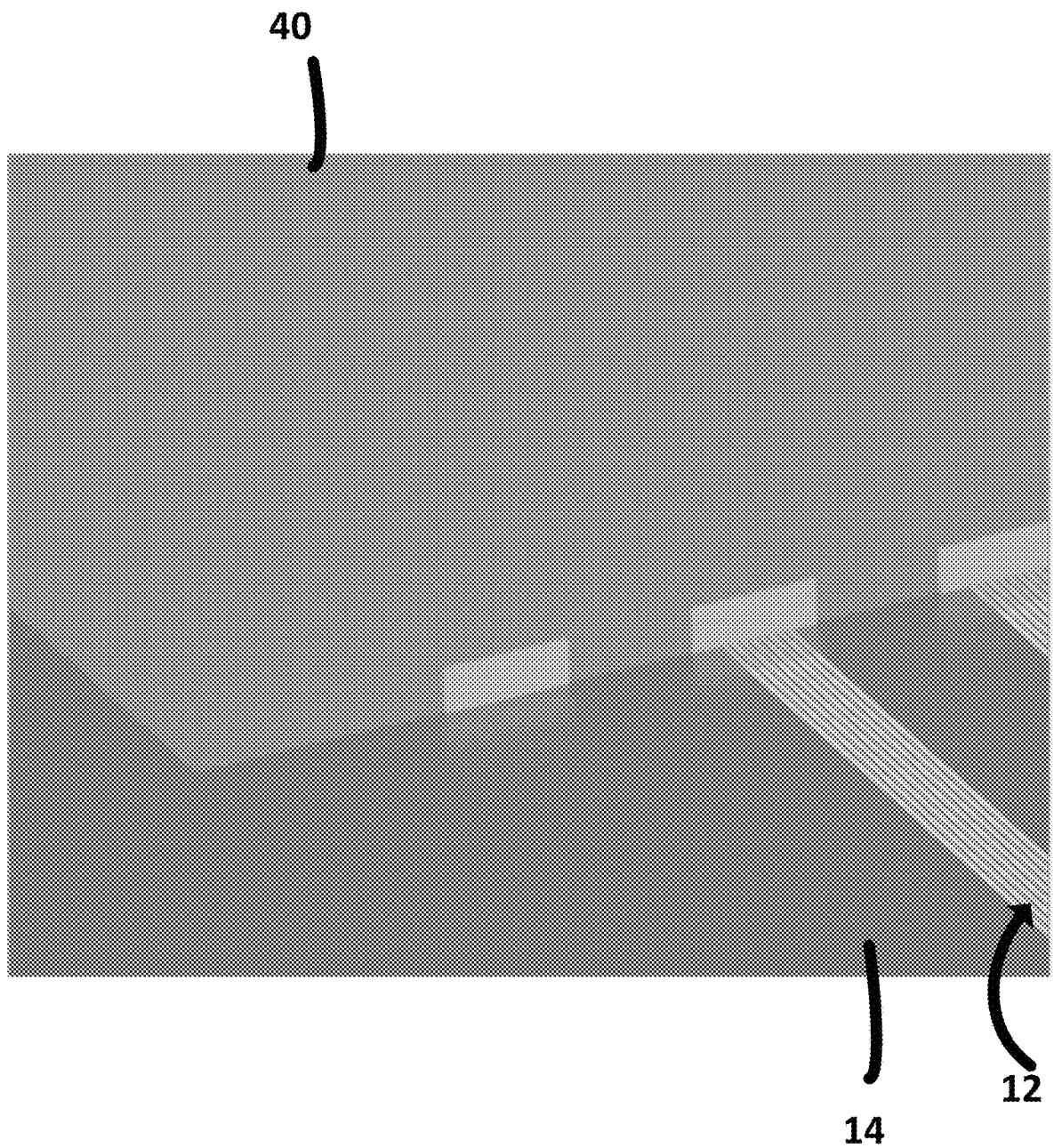
FIG. 6 illustrates a litz line extending to an integrated circuit.

FIG. 6 illustrates a litz line 12 extending to an integrated circuit 40. The litz line may connect directly to the integrated circuit 40.

Figure 7:
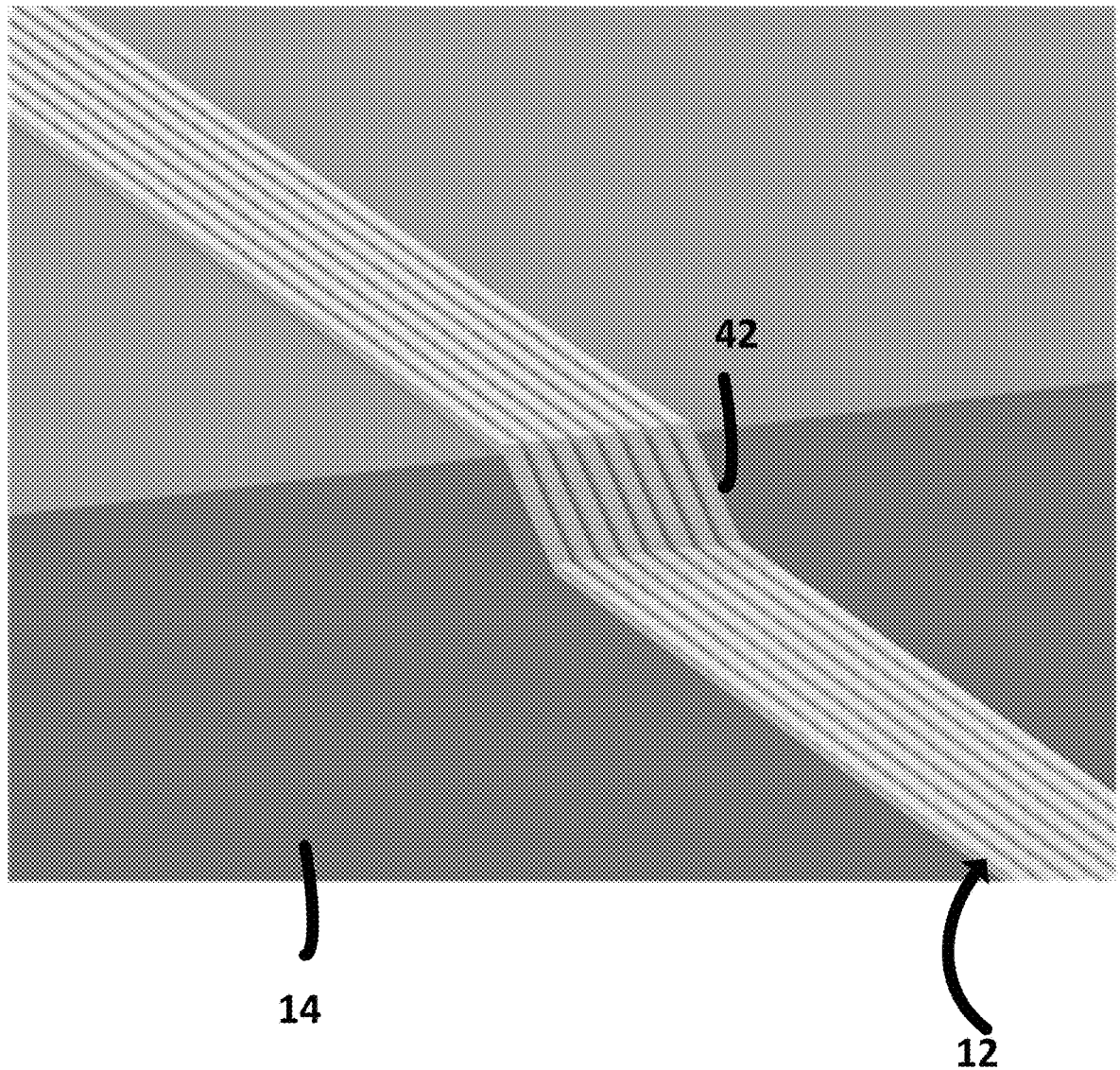
FIG. 7 illustrates a litz line with a ramp transition.

FIG. 7 illustrates a litz line with a ramp transition 42. The litz line need not be limited to a flat surface but may be placed on conformal surfaces and may extend along a ramp transition 42.

Figure 8:
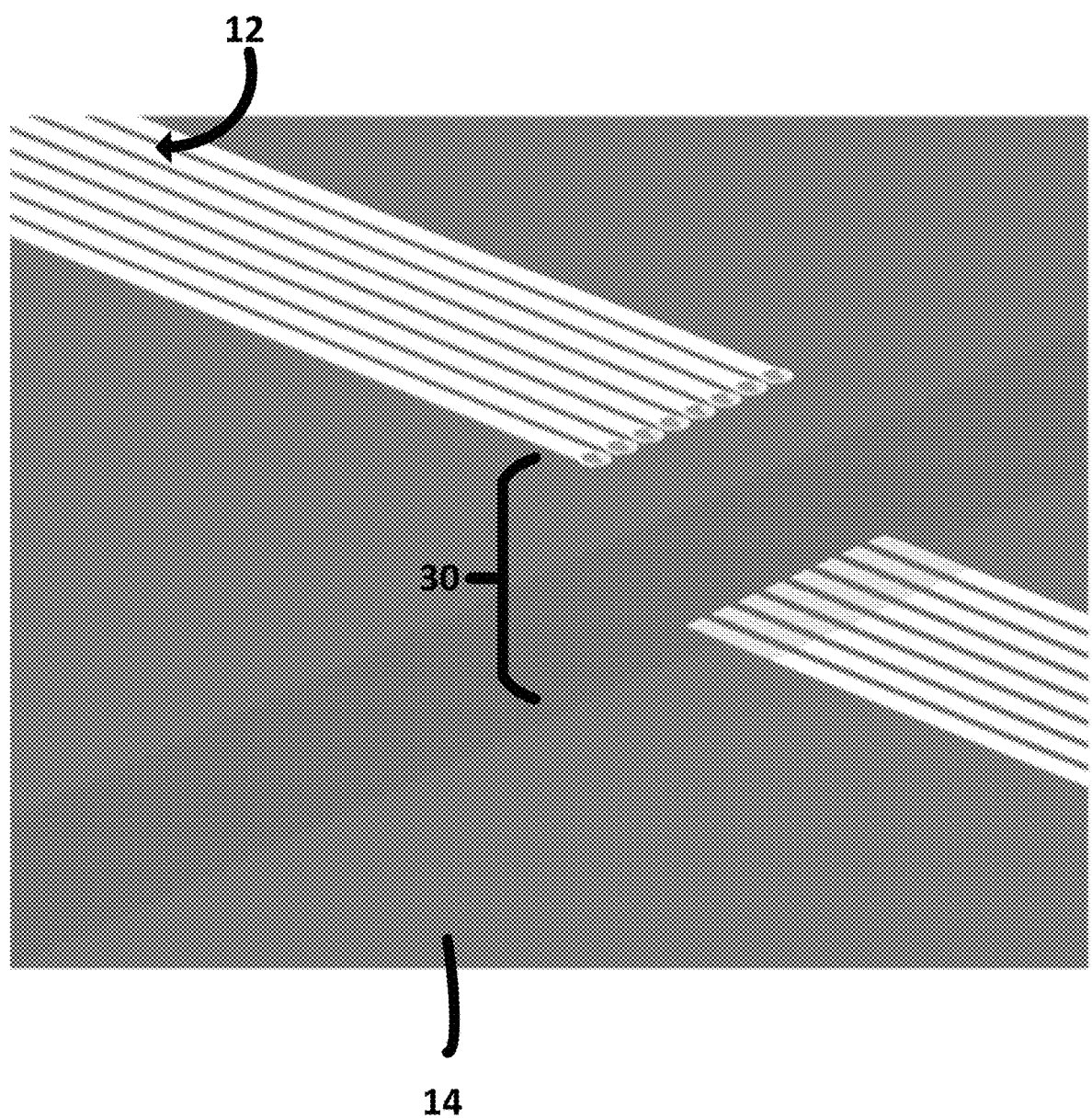
FIG. 8 illustrates a litz line with a via transition.
Figure 9:
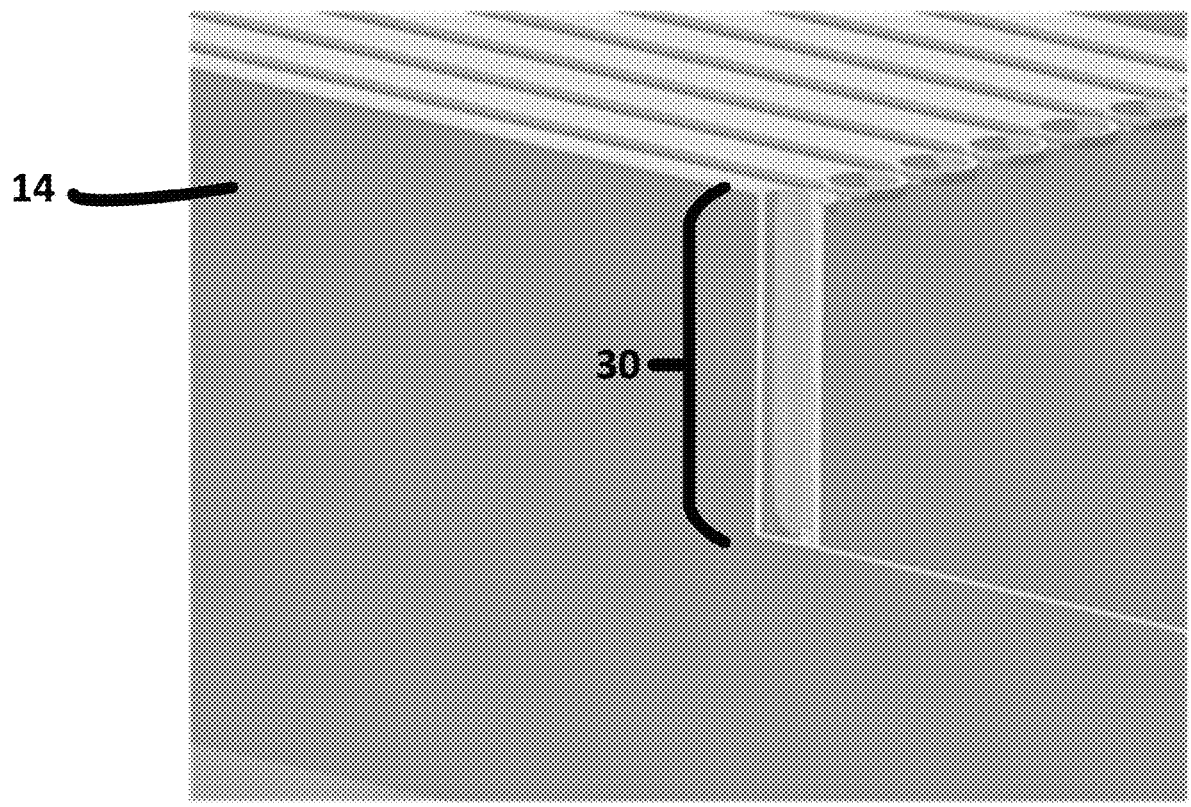
FIG. 9 illustrates a cross-section of a via transition for a litz line.
Figure 10:
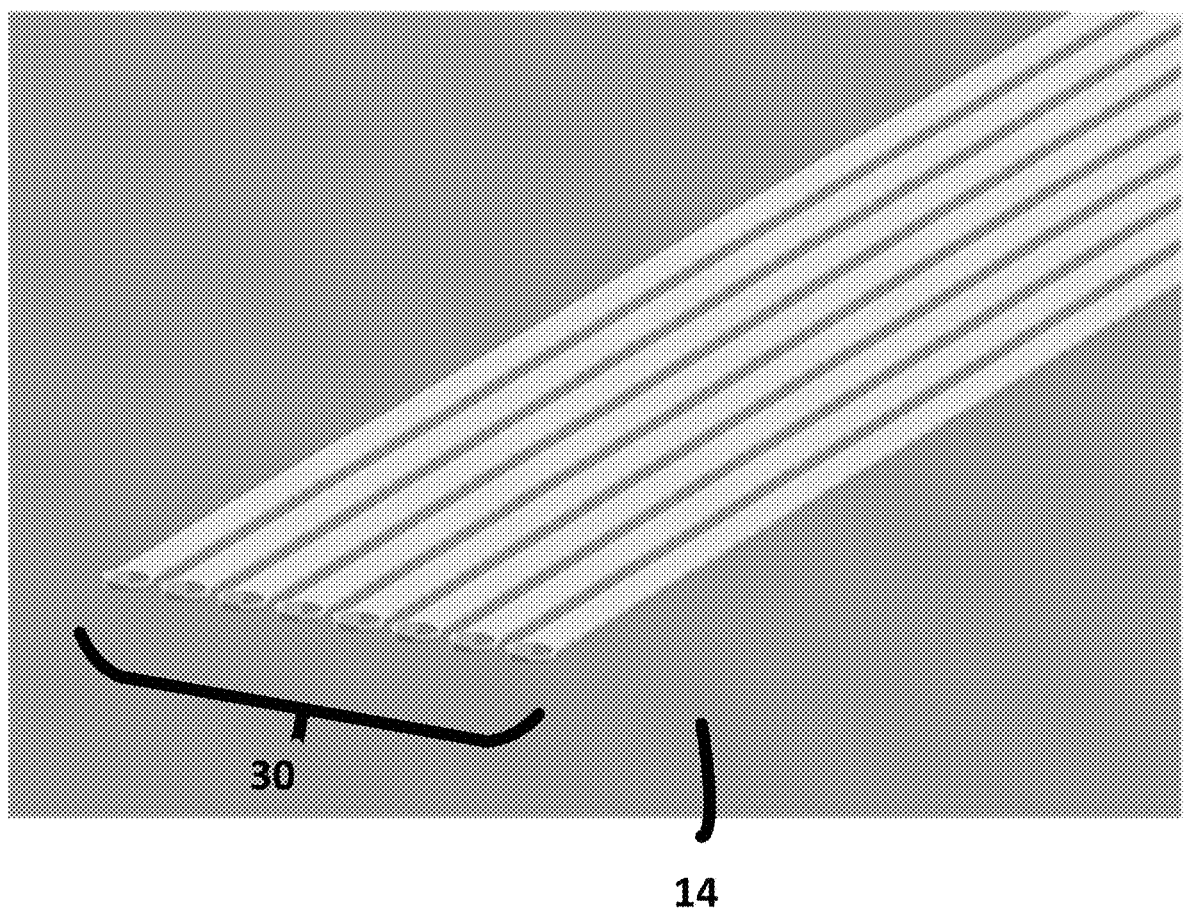
FIG. 10 illustrates a litz line ending in a via.

FIG. 8 illustrates a litz line 12 with a via transition 30. FIG. 9 illustrates a cross-section of the via transition 30 for a litz line. FIG. 10 illustrates a litz line ending in a via transition 30. Thus, the lines may also be extended through vias such as shown in FIG. 8 through FIG. 10. It is contemplated that the lines may take different forms based on the manufacturing methods and/or the type of via. The line may extend along a vertical surface of the via. The structure of the via may be based in part on the manner in which a pattern is modified to remove materials.

Thus, an equivalent of an RF litz wire is provided which may include a plurality of conductive traces with slots which can be used for transmitting an RF signal. Such a design helps distribute current and increases performance. This further provides an advantage over existing transmission lines such as microstrips and co-planar waveguides. The design may be used to improve improved transmission of RF signals and may be used in a number of applications. Thus, the benefits seen from conventional litz lines may be realized at higher frequencies. With the current push to higher frequency devices for improved data rates and the looming transition to 5G network (which may use a 15 GHz frequency band), this technology has a large importance and can be used in a number of devices.

Although the present invention offers improvements to many processes, it is particularly useful where low temperature conductor processes are used, especially when paired with a laser for cutting the slots as shown in FIG. 1. The laser cutting increases the conductivity of the silver by sintering the material at the edge of the cut. This results in near solid silver at the edges. In the litz line design, the edges of the lines are the location for most of the current which makes them critical for performance. Thus, laser cutting of the slots is highly beneficial for low conductivity materials.

The invention is not to be limited to the particular embodiments described herein. In particular, the invention contemplates numerous variations in the type of conductive material, the pattern, the method in which the pattern is created, the removal process, the number of conducting lines, and other variations. The foregoing description has been presented for purposes of illustration and description. It is not intended to be an exhaustive list or to limit any of the invention to the precise forms disclosed. It is contemplated that other alternatives or exemplary aspects are considered included in the invention. The description is merely examples of embodiments, processes or methods of the invention. It is understood that any other modifications, substitutions, and/or additions can be made, which are within the intended spirit and scope of the invention.

What is claimed is:

1. A method of manufacturing an electronic circuit comprising:
    forming a printed litz line on a substrate, the forming the printed litz line comprising a plurality of conductive tracts for distributing a signal in order to increase effective conductance relative to a single conductive line;
    wherein the forming the printed litz line on the substrate comprises printing a pattern comprising a conductive material on the substrate and removing a portion of the pattern to leave the plurality of conductive tracts on the substrate.

2. The method of claim 1 wherein the removing the portion of the pattern is performed using a removal process selected from a set consisting of laser cutting, milling, etching, and masking.

3. The method of claim 1 further comprising trimming edges of the pattern.

4. The method of claim 1 wherein the pattern comprises a line having a thickness of less than 100 μm.

5. The method of claim 1 wherein the substrate is a non-planar conformal surface having a plurality of bends.

6. The method of claim 1 wherein a portion of the pattern extends through a via.

7. The method of claim 1 wherein the forming the printed litz line is performed using a process selected from a set consisting of a jetting process, a spray process, an extrusion process, a dispensing process, and other processes for applying materials.

8. A method of manufacturing an electronic circuit comprising:
    forming a printed litz line comprising a plurality of conductive tracts for distributing a signal in order to increase effective conductance relative to a single conductive line; wherein the forming the printed litz line comprises printing a pattern comprising a conductive material on a substrate and removing a portion of the pattern to leave the plurality of conductive tracts;
    wherein the removing the portion of the pattern is performed by applying ultrashort laser pulses and wherein the substrate is a surface of a bare die.

9. The method of claim 8 wherein the removing the portion of the pattern is performed using a removal process selected from a set consisting of laser cutting, milling, etching, and masking.

10. The method of claim 8 further comprising trimming edges of the pattern.

11. The method of claim 8 wherein the pattern comprises a line having a thickness of less than 100 μm.

12. The method of claim 8 wherein the substrate is a non-planar conformal surface having a plurality of bends.

13. The method of claim 8 wherein a portion of the pattern extends through a via.

14. The method of claim 8 wherein the forming the printed litz line is performed using a process selected from a set consisting of a jetting process, a spray process, an extrusion process, a dispensing process, and other processes for applying materials.

* * * * *